United States Patent [19]

Chai et al.

[11] Patent Number: 4,525,643
[45] Date of Patent: Jun. 25, 1985

[54] TEMPERATURE COMPENSATED ORIENTATIONS OF BERLINITE FOR SURFACE ACOUSTIC WAVE DEVICES

[75] Inventors: Bruce H. Chai, Bridgewater, N.J.; Dana S. Bailey, Columbia, Md.; John F. Vetelino, Veazie, Me.; Donald L. Lee, Orono, Me.; Jeffrey C. Andle, Bangor, Me.

[73] Assignee: Allied Corporation, Morris Township, Morris County, N.J.

[21] Appl. No.: 546,677

[22] Filed: Oct. 28, 1983

[51] Int. Cl.$^3$ .............................................. H01L 41/08
[52] U.S. Cl. .................................. 310/313 A; 310/360
[58] Field of Search ............... 310/313 A, 360, 313 R; 333/193, 150, 155

[56] References Cited

U.S. PATENT DOCUMENTS 4,109,172  8/1978  O'Connell ......................... 310/313
4,109,173  8/1978  O'Connell ....................... 310/360 X
4,382,840  5/1983  Chai et al. ........................... 156/623

OTHER PUBLICATIONS

IEEE Trans. Sonics and Ultrasonics, vol. SU-23, No. 2, (Mar. 1976), "Elastic Constants and Thermal Expansion of Berlinite"–Chang et al., pp. 127-135.
Acoustic Surface Waves, by G. S. Kino et al., *Scientific American*, Oct. 1972.
*IEEE Trans. Sonics and Ultrasonics*, vol. SU-23, No. 6, (Nov. 1977), "High Piezoelectric Coupling Temperature Compensated Cuts of Berlinite (AlPO$_4$) for SAW Applications" O'Connell et al., pp. 376-384.
*Ferroelectric*, 1982, vol. 42, "Piezoelectric Crystals for Surface Acoustic Waves" Henaff et al., pp. 161-180.
*J. Applied Physics*, vol. 48, No. 3, (Mar. 1977), "Berlinite, a Temperature-Compensated Material for Surface Acoustic Wave Applications"–Jhunjhunwala et al., pp. 887-892.

Primary Examiner—Mark O. Budd
Attorney, Agent, or Firm—James Riesenfeld; Gerhard H. Fuchs

[57] ABSTRACT

A piezoelectric wafer of single crystal berlinite, having a surface defined by an X-axis boule cut at an angle in the range from about 94°-104°, provides an improved substrate for a surface acoustic wave device. These cut angles are relatively easy to fabricate, provide excellent temperature compensation in a range from −55° C. to 125° C., and have high piezoelectric coupling coefficient.

3 Claims, 2 Drawing Figures

TEMPERATURE COMPENSATED ORIENTATIONS OF BERLINITE FOR SURFACE ACOUSTIC WAVE DEVICES

BACKGROUND OF THE INVENTION

1. Field of the Invention

This invention relates to an optimal orientation of berlinite (alpha-aluminum orthophosphate) for surface acoustic wave (SAW) device applications.

2. Description of the Prior Art

SAW technology for signal processing has reached maturity. A broad range of devices is now produced in substantial quantity for both military and commercial applications. These devices, for use in the VHF and UHF range, include filters, oscillators, delay lines, convolvers, and various types of sensors. Processes for preparing these devices are well-known in the art (see, e.g., H. I. Smith, "Surface Wave Device Fabrication," in Surface Wave Filters, edited by H. Matthews (Wiley, New York, 1977), pp. 165-217). The devices typically involve interdigitated electrodes (see, e.g., G. S. Kino et al., "Acoustic Surface Waves," Amer., October, 1972, p. 51)

Nearly all SAW devices currently are produced either on ST-cut quartz or lithium niobate substrates. ST-cut quartz has excellent thermal stability but a rather low piezoelectric coupling coefficient. Lithium niobate has strong piezoelectric coupling but poor temperature stability. A few SAW devices are made on lithium tantalate, which has moderate piezoelectric coupling and fair temperature stability.

All crystals that lack a center of inversion symmetry are piezoelectric. Very few of them have temperature compensated orientations, however, because that depends on their having one of the following anomalous properties: (1) a positive temperature coefficient of one or more elastic constants or (2) a negative coefficient of thermal expansion. Berlinite is isotructural with alpha-quartz, and, as is true with quartz, one of its elastic constants ($C_{66}$) has a positive temperature coefficient. Barsch and Chang (IEEE Trans. Sonics Ultrason. SU-23, 127 (1976)) determined the berlinite equivalents of the temperature compensated quartz cut for bulk acoustic wave devices and also found that piezoelectric coupling of berlinite was several times larger than that of quartz. Subsequently, several researchers have predicted temperature compensated berlinite cut for SAW devices, using calculations based on Barsch and Chang's elastic, dielectric, and piezoelectric constants, and their temperature co-efficients. Among these predictions are X-axis boules cut at 80.4° (U.S. Pat. No. 4,109,172, issued Aug. 22, 1978, to O'Connell); 87.1° (Henaff et al., Ferroelectrics 42, 161 (1982)); and 92.75° (Jhunjhunwala et al., J. Appl. Phys. 48, 887 (1977)).

A hydrothermal process and apparatus for growing berlinite crystals suitable for use in this invention were disclosed in U.S. Pat. No. 4,382,840, issued May 10, 1983, to chai et al.

SUMMARY OF THE INVENTION

In accordance with the present invention, a berlinite single crystal is provided having a substantially planar surface defined by the Euler angles $\lambda$ equals about 0°, $\mu$ equals about 94°-104°, and $\theta$ equals about 0°. The crystals find application as substrates for SAW devices having excellent temperature compensation and higher piezoelectric coupling than ST-cut quartz.

DETAILED DESCRIPTION OF THE INVENTION

When cut in the orientation taught by the present invention, berlinite provides improved substrates for surface acoustic wave (SAW) devices. Preferably, the substrates are in the form of wafers; i.e., thin slices having two substantially planar surfaces. At least one of the planar surfaces (for convenience, the "top" surface) is cut with an orientation that gives a temperature compensated cut of the present invention. As is well known in the SAW device art, this top surface is preferably made very flat and smooth, e.g., by chemopolishing, before the SAW circuit is placed upon it. The other planar surface need not be very flat; in fact, it may be roughened slightly to minimize the effect of internally reflected bulk waves. The effect of bulk wave internal reflection may also be reduced by having the planar surfaces non-parallel. Wafer thickness is not critical, but the range from 0.5 to 1 mm is typical. The shape of the wafer perimeter is also not critical.

SAW devices are used for a large variety of electronic applications, primarily involving high frequencies (20 MHz to 1500 MHz). A simple example is a transversal SAW filter, which has two transducers at opposite edges of a piezoelectric substrate. An electrical signal applied to the input transducer creates in the surface a series of mechanical distortions (i.e., a surface acoustic wave) that moves toward the output transducer, where the mechanical signal is transformed back to an electrical signal. The signal filtering is determined by how the tranducers convert electrical to mechanical signals.

Generally, the most important filter parameters are center frequency and bandwidth, and these parameters depend, in part, on the substrate material and its crystal orientation. Depending on the particular application, it is desirable or essential that the center frequency be substantially independent of temperature. Another way of stating this is that the temperature coefficient of transit time, or delay (TCD) of the surface acoustic wave be zero. When TCD=0, the material is said to be temperature compensated. A practical device must generally operate over a range of temperatures; thus, an ideal material has zero (or nearly zero) TCD over the operating temperature range. For certain applications, devices must meet military specifications (MIL SPECS), which designate the operating range as −55° C. to 125° C. For these applications, therefore, optimum cut angles are those that provide the best temperature compensation throughout that range. Furthermore, all things being equal, desirably broad bandwidth requires large piezoelectric coupling. Thus, desirable substrates combine temperature compensation with high piezoelectric coupling. Berlinite is among several piezoelectric materials that have been reported to have temperature compensated cuts; i.e., crystal orientations for which TCD=0.

Figure 1:
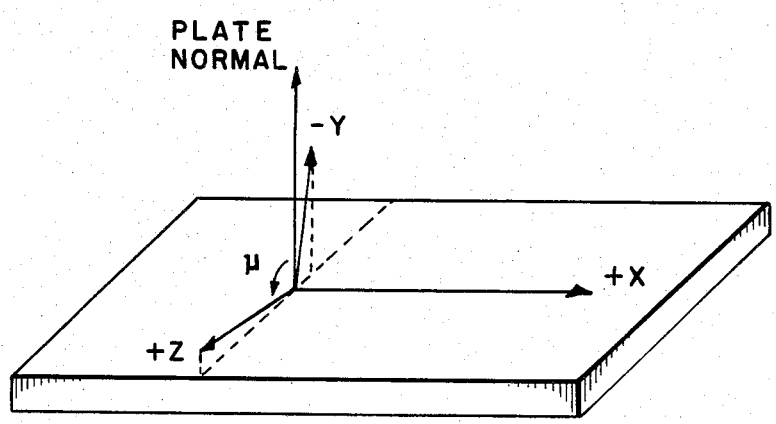
FIG. 1 depicts an X-axis boule wafer of berlinite.

The crystal orientations are described by their Euler angles, $\lambda$, $\mu$ and $\theta$. These represent the angles by which rotations are made in a specific sequence about the propagation axes 1, 2, and 3, to transform the axes relative to the crystalline axes X, Y and Z, starting with 1, 2, and 3 being aligned with X, Y and Z, respectively (see O'Connell et al., IEEE Trans. Sonics Ultrason. *SU*-24, 376 (1977)). The orientations of the wafer of the present invention are described by only a single rotation around the "1" axis, which coincides with the X axis. This singly rotated orientation, called an "X-axis boule," is shown in FIG. 1. When the rotation angle, $\mu$, is an agle in the range from about 94° to about 104°, the wafer has excellent temperature compensation over a broad range of temperatures.

Figure 2:
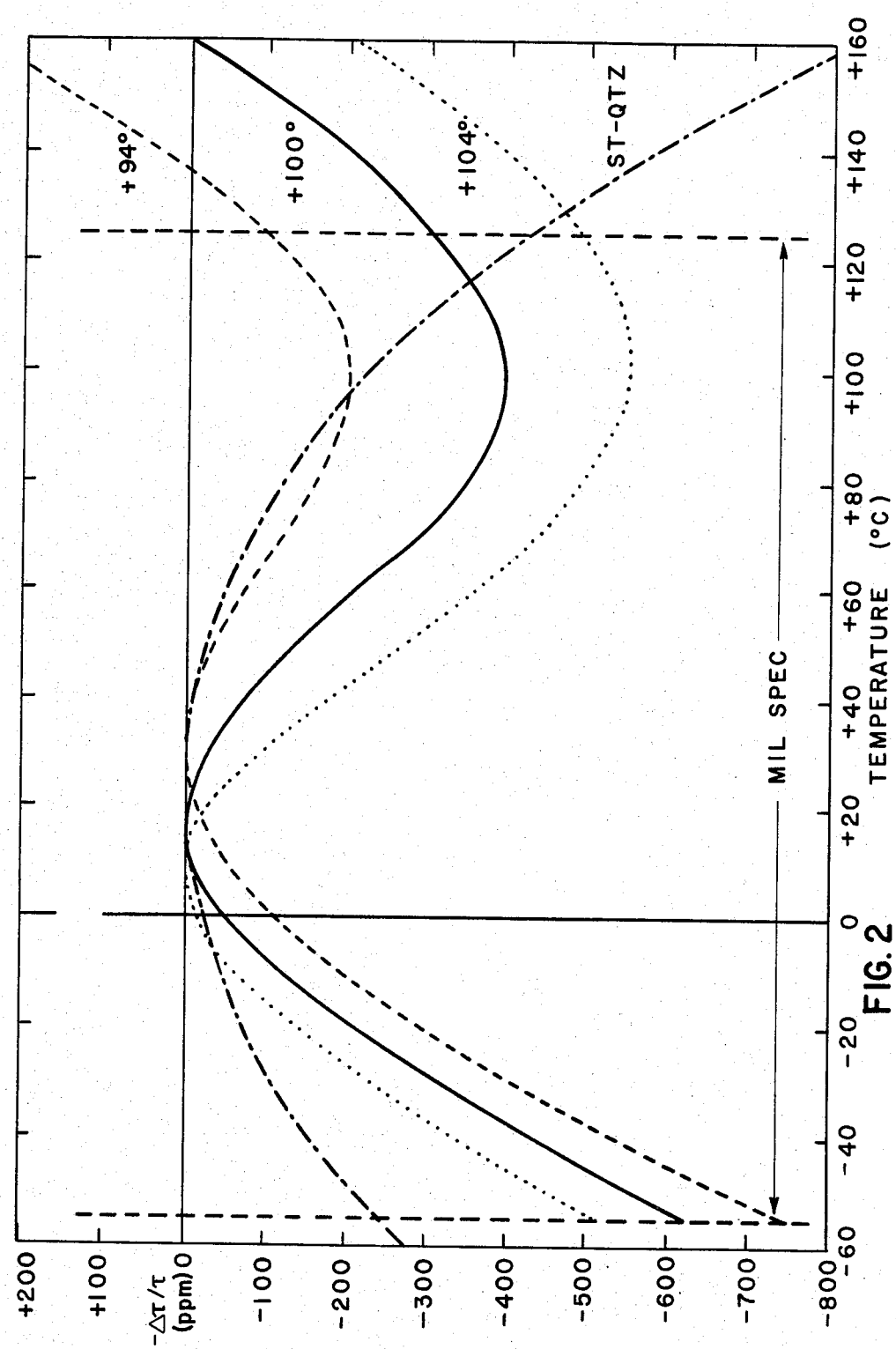
FIG. 2 is a graph of the temperature dependence of time delay for cut angles at 94°, 100°, and 104°.

As is seen in the graph of fractional change in time delay as a function of temperature (FIG. 2), the delay is within ±750 ppm from the delay at T=30° C. in the temperature range T=−55° C. to T=125° C. Thus, devices formed on berlinite substrates having cuts at angles in the range from abut 94° to 104° provide the best temperature compensation in the MIL SPEC (−55° C.-125° C.) temperature range.

The present cuts (0°, 94°-104°, 0°) also have several advantages in addition to temperature compensation:

1. A singly rotated cut is substantially easier to orient and to slice accurately, particularly in a mass production mode.

2. These orientations have close to the maximum piezoelectric coupling in berlinite.

3. The power flow angle is zero and the slope of power flow angle is also small, indicating good tolerance of SAW pattern alignment errors (i.e., SAW propagation direction error).

4. The slope of the first order temperature coefficient contour map is also very small, indicating good tolerance of errors in the plate orientation introduced during cutting.

5. When bulk berlinite crystals are grown from a basal seed—(001) seed plate—these orientations give high cutting yield of material.

We claim:

1. A berlinite single crystal having a substantially planar surface defined by the Euler angles $\lambda$=about 0°; $\mu$=about 94°-104°; and $\theta$=about 0°.

2. A surface acoustic wave device comprising interdigitated electrodes on the planar surface of the crystal of claim 1.

3. The device of claim 2 in which the crystal is in the form of a wafer.

* * * * *